(12) United States Patent
Reina et al.

(10) Patent No.: US 11,599,273 B2
(45) Date of Patent: Mar. 7, 2023

(54) PROVIDING TIME-STAMPS FOR A MEMORY DEVICE AND METHOD FOR MANAGING THE SAME

(71) Applicant: Micron Technology, Inc., Boise, ID (US)

(72) Inventors: Vincenzo Reina, Munich (DE); Alberto Troia, Munich (DE)

(73) Assignee: Micron Technology, Inc., Boise, ID (US)

( * ) Notice: Subject to any disclaimer, the term of this patent is extended or adjusted under 35 U.S.C. 154(b) by 226 days.

(21) Appl. No.: 16/625,130

(22) PCT Filed: Jan. 29, 2019

(86) PCT No.: PCT/IB2019/000010
§ 371 (c)(1),
(2) Date: Dec. 20, 2019

(87) PCT Pub. No.: WO2020/157529
PCT Pub. Date: Aug. 6, 2020

(65) Prior Publication Data
US 2021/0342074 A1 Nov. 4, 2021

(51) Int. Cl.
*G06F 3/06* (2006.01)
(52) U.S. Cl.
CPC .......... *G06F 3/0619* (2013.01); *G06F 3/0655* (2013.01); *G06F 3/0679* (2013.01)
(58) Field of Classification Search
CPC ..... G06F 3/0619; G06F 3/0679; G06F 3/0655
See application file for complete search history.

(56) References Cited

U.S. PATENT DOCUMENTS

| 2013/0007344 A1* | 1/2013 | Belgal | G11C 16/3418 711/103 |
| 2013/0275795 A1* | 10/2013 | Ellis | G06F 1/3268 713/324 |
| 2014/0310445 A1 | 10/2014 | Fitzpatrick et al. | |

(Continued)

OTHER PUBLICATIONS

International Search Report and Written Opinion from related international application No. PCT/IB2019/000010, dated Oct. 15, 2019, 15 pages.

*Primary Examiner* — Mark A Giardino, Jr.
(74) *Attorney, Agent, or Firm* — Brooks, Cameron & Huebsch, PLLC

(57) ABSTRACT

An example method for managing a memory device includes a non-volatile memory. The example method further includes providing a first time-stamp to the memory device, wherein the first time-stamp is a power-down time-stamp of the memory device, storing the first time-stamp, associating the first time-stamp with at least one region of the non-volatile memory, providing a second time-stamp to the memory device, wherein the second time-stamp is a subsequent power-up time-stamp of the memory device, associating the second time-stamp with the at least one region of the non-volatile memory, determining a difference time between the first time-stamp and the second time-stamp, and, based on the difference time, performing a refresh operation of the at least one region of the non-volatile memory. Further, a related memory device is disclosed, as well as a method for measuring the off-time of a memory device.

22 Claims, 2 Drawing Sheets

(56) References Cited

U.S. PATENT DOCUMENTS

| | | | | |
|---|---|---|---|---|
| 2015/0043284 A1* | 2/2015 | Sakuma | ............... | G11C 16/349 |
| | | | | 365/185.25 |
| 2019/0034114 A1* | 1/2019 | Natarajan | ............. | G06F 3/0619 |
| 2019/0334912 A1* | 10/2019 | Sloane | .................... | G06F 16/23 |
| 2020/0225876 A1* | 7/2020 | Du | ........................ | G06F 11/073 |

* cited by examiner

PROVIDING TIME-STAMPS FOR A MEMORY DEVICE AND METHOD FOR MANAGING THE SAME This application is a National Stage Application under 35 U.S.C. § 371 of International Application Number PCT/IB2019/000010, filed Jan. 29, 2019, the entire contents of which are incorporated herein by reference in its entirety.

TECHNICAL FIELD

The present disclosure relates generally to methods and devices concerning non-volatile memories, such as NAND memories.

BACKGROUND

It is known that non-volatile memory devices undergo data retention degradation, i.e. corruption or even loss of data in the non-volatile memory. Such data retention degradation is due to several causes, such as a charge loss and stress-induced leakage, as well as the usage of the device itself. Data retention degradation is also a function of the temperature of the non-volatile memory.

The data in the non-volatile memory can thus be properly retained only for a finite amount of time, this amount of time being referred to as retention time limit. Beyond this time limit, data can be corrupted or lost.

When the memory device is in the on-state, the temperature, the time and other operating parameters can be monitored, and therefore a refresh operation can be performed when needed, while in the off-state these parameters can neither be monitored nor calculated. Therefore, the refresh policy is applied without accounting for the ratio between the on-time and the off-time of the memory device.

The aim of the present disclosure is to solve the above-mentioned drawbacks, providing a memory device and a method for managing the same able to precisely evaluate when a region of the non-volatile memory has to be refreshed to avoid corruption or loss of data.

DETAILED DESCRIPTION

Figure 1:
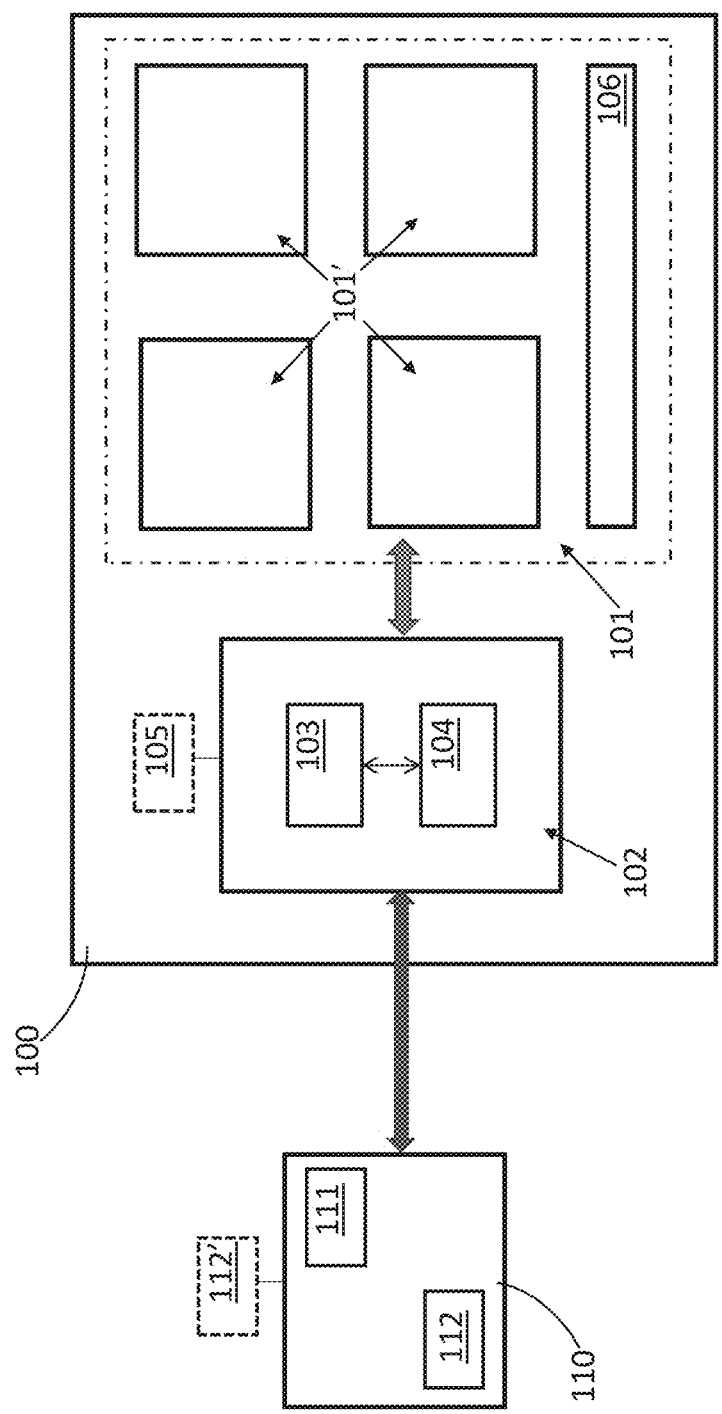
FIG. 1 shows a schematic block diagram of a memory device according to the disclosure.

With reference to those figures, methods and devices involving non-volatile memories will be disclosed herein.

More particularly, as it will be described into details in the following, an example method for managing a memory device includes the steps of providing a first time-stamp to the memory device, wherein the first time-stamp is the power-down time-stamp of the memory device, storing the first time-stamp, associating the first time-stamp with at least one region of the non-volatile memory, providing a second time-stamp to the memory device, wherein the second time-stamp is a subsequent power-up time-stamp of the memory device, associating the second time-stamp with said at least one region of the non-volatile memory, determining a difference time between the first time-stamp and the second time-stamp, and, based on said difference time, automatically performing a refresh operation of said at least one region of the non-volatile memory.

Disclosed herein is also a memory device comprising a non-volatile memory and a controller of the non-volatile memory, wherein the controller is configured to receive a first time-stamp, wherein the first time-stamp is the power-down time-stamp of the memory device, store the first time-stamp, associate the first time-stamp with at least one region of the non-volatile memory, receive a second time-stamp, wherein the second time-stamp is a subsequent power-up time-stamp of the memory device, associate the second time-stamp with said at least one region of the non-volatile memory, determine a difference time between the first time-stamp and the second time-stamp, and, based on said difference time, automatically perform a refresh operation of said at least one region of the non-volatile memory. In particular, the controller is configured to increment a time-counter representative of an elapsed time associated with the at least one region of the memory device, the refresh operation being performed in case the elapsed time is equal to or exceeds a threshold time, and said threshold time can be equal to or lower than the retention time limit of the non-volatile memory. Moreover, the time-counter of the memory device is representative of a total time elapsed from the moment a data is written into said at least one region of the non-volatile memory, and wherein said time-counter is reset each time a refresh operation is performed.

Finally, disclosed herein is also a method for measuring the off-time of a memory device including a non-volatile memory, the method comprising providing a first time-stamp at a power-down of the memory device, storing the first time-stamp in the non-volatile memory, associating the first-time stamp with at least one region of the non-volatile memory, providing a second time-stamp at a subsequent power-up of the memory device, associating the second-time stamp with said least one region of the non-volatile memory, and determining a difference time between the first time-stamp and the second time-stamp, wherein the difference time is the off-time of the memory device.

Advantageously, the memory device of the present disclosure is extremely reliable due to the above-mentioned automatic refresh operation, which is performed based on the calculation of the memory device off-time, i.e. by considering the alternation between the power-on and the power-down events of the memory device. This is achieved by using a very simple solution, whose working logic is much simpler than that of known wear-leveling methods and only requires a comparison between different time-stamps. The proposed solution is useful for memory devices that undergo several power-down and subsequent power down events, i.e. where there is the need to precisely know the off-time of the memory device to avoid data corruption or even data loss, the refresh policy being applied according to the measured time-stamp difference. More in particular, the proposed solution is useful for devices characterized by long power-down times. The proposed solution can also be used in addition to the known wear-leveling methods.

FIG. 1 is a schematic block diagram of a memory device 100 according to the present disclosure.

The memory device 100 comprises a non-volatile memory 101 and a memory controller 102 of the non-volatile memory 101. The controller 102 can include an embedded firmware and is adapted to manage and control the operation of the non-volatile memory 101.

The memory device 100 can also comprise other components, such as processor units coupled to the controller 102, antennas, connection means (not shown) with a host device 110, and the like.

In particular, the controller 102 includes a refreshing unit 103 configured to automatically refresh data of the non-volatile memory 101. The refreshing unit 103 can be a microprocessor or a microcontroller programmed to perform the automatic refresh operation as described below in greater detail. The controller 102 can also include a memory 104 (such as a RAM) operatively coupled with the unit 103 and including program instructions to be executed by said refreshing unit 103. In any case, the present disclosure is not limited to a particular embodiment of the controller 102.

The memory device 100 may be a portable device configured to be coupled to the host device 110. However, in other embodiments not shown in the drawings the memory device 100 can also be embedded within one or more host devices.

The non-volatile memory 101 of the memory device 100 can be a flash memory, for example a NAND memory, NOR memory, AND memory, and the like, preferably a NAND memory. The memory device 100 can thus be for example a NAND-based solid state (SSD) drive. However, the present disclosure is not limited to a specific type of memory and memory device.

Non-volatile memories comprise a plurality of blocks, which are the smallest erasable entities thereof, each block being indicated herein with the reference number 101' and comprising a defined number of pages. For the sake of simplicity, only four blocks 101' are shown in FIG. 1.

According to an embodiment, the controller 102 is responsible for interfacing the non-volatile memory 101 with the host 110 and for programming the non-volatile memory 101. The controller is 102 configured to receive data and information from the host device 110, such as time information, as it will be disclosed in the following in greater detail.

The host device 110 comprises a processor 111 and a clock unit 112, and can be for example a personal computer, a tablet, a smart-phone, a server or the like. In another embodiment, the host 110 can be connected with an external clock unit 112'.

The host device 110 can be used to program the memory device 100, for example to store, via the controller 102, the retention time limit of the non-volatile memory 101, such retention time limit being usually specified in the datasheet of the memory device non-volatile memory 101.

The clock unit 112 of the host device 110 provides date and time information to the controller 102, which is thus able to store this information in the non-volatile memory 101.

In an embodiment, also the memory device 100 can be equipped with one or more clock unit 105 coupled to the controller 102.

Advantageously according to the present disclosure, a first time-stamp is provided to the memory device 100, this time stamp being associated with a specific event of the memory device 100. In particular, in the present disclosure, the first time-stamp is the power-down time-stamp of the memory device 100, i.e. it is the time-stamp that is stored when the device is turned off.

The first time-stamp is stored in a dedicated non-volatile area 106 of the non-volatile memory 101, such area 106 being enabled for storing operative information of the non-volatile memory 101.

The stored first time-stamp is then associated with at least one region of the non-volatile memory 101.

The region of the non-volatile memory 101 associated with the stored time-stamp can be a page, a single block, a group of blocks, or even all blocks of the non-volatile memory 101, the invention not being limited thereto.

More particularly, according to the present disclosure, the term "region" indicates herein a block or group of blocks of the memory comprising stored data that at a certain point in time will have to be refreshed, while the term "area 106" indicates a non-volatile memory block enabled for containing operative information relating to said regions, such information including for example time information (e.g. the time-stamps) as well as erase-cycles information. The information stored in the area 106 can be common to all the regions of the non-volatile memory or can be related only to single regions or group of regions of said memory. All this information can be previously programmed in the memory device 100 via the controller 102.

In any case, according to the present disclosure, the power-down time is stored in the non-volatile memory 101 and can be used to determine the off-time of the memory device 100, as it will be specified in the following.

The time-stamps, i.e. the data and/or time information, are preferably provided in the form of a Unix time-stamp, which is a universally known time-format, although the present disclosure is not limited thereto, and other suitable data/time formats can obviously be used.

In an embodiment of the present disclosure, the time-stamp is provided by the host device 110, as shown above, although the present disclosure is not limited to any specific hardware architecture.

A second time-stamp is then provided to the memory device 100 and stored in the non-volatile memory 101, in particular in the same dedicated area 106 of the non-volatile memory 101 in which the first time-stamp has been previously stored. According to the present disclosure, the second time-stamp is a power-up time-stamp of the memory device 100, i.e. the time-stamp that is stored when the device is subsequently turned on.

The second time-stamp is associated with the same region/s of the non-volatile memory 101 which the first time-stamp has been associated with, such region/s of the non-volatile memory 101 being therefore provided with the proper time information.

According to the present disclosure, the first time-stamp is stored in the non-volatile memory 101 each time the memory device 100 is powered-down and the second time-stamp is stored in the non-volatile memory 101 each time the memory device 100 is powered-up.

Advantageously according to the present disclosure, the controller 102 is configured to compare the second time-stamp with the first time-stamp to determine a difference time therefrom. The difference time calculated by the controller 102 thus corresponds to the overall off-time of the memory device 100, this time being associated with the region/s of the non-volatile memory 101 storing data to be refreshed.

The controller 102 is configured to increment a time-counter (not shown in the figures) that accounts for an elapsed time associated with the region/s of the non-volatile memory 101. In particular, the time-counter counts or is representative of the time that has elapsed form the moment when a data is written in the region/s of the non-volatile memory, said elapsed time being suitably incremented by the measured off-time of the device each time the memory device is powered on.

In other words, it is possible to count the total time elapsed from the event when a data is written/stored, adding to the measured on-time also the off-time of the device, the off-time being measured by calculating the difference between the first time-stamp (i.e. the one when the device is turned off) and the second time-stamp (i.e. the one when the device powers up again).

When the memory device 100 is in the on-state, the on-time is continuously counted by the time-counter, i.e. the time-counter counts the time from each power-on event of the memory device 100 up to a subsequent power-down event. For this reason, by sampling from time to time the time counted by the counter, the on-time of the device can be measured and stored in the non-volatile memory 101.

As previously mentioned, the elapsed time is then increased by the measured difference time each time the device is powered on, in this way taking into account also for the off-time of the memory device 100.

Advantageously according to the present disclosure, a refresh operation of the region/s of the non-volatile memory 101 is performed by the refreshing unit 103 in case the elapsed time is equal to or exceeds a threshold time that has been previously stored in the non-volatile memory 101, in particular stored in the dedicated area 106, this threshold time being in particular lower than or equal to the retention time limit of the non-volatile memory 101. Therefore, the memory device 100 is suitably adapted to automatically refresh data in the non-volatile memory 101 when approaching the retention time limit, based on the measured difference time between the first time-stamp and the second time-stamp.

The refresh operation is not limited to a specific operation and may include several operations, such as a read scrub, moving data from the particular region to a different region, or some other refresh actions.

According to the present disclosure, the provided time information is stored in a register, which is in turn stored in the dedicated area 106 of the non-volatile memory 101. Therefore, each time new time-stamp is generated and provided to the non-volatile memory 101, said register is updated.

The register has at least one field for the power-up time-stamps and one field for the power-down time-stamps. The determination of the off-time of the device therefore includes the comparison of the above indicated fields of the register, the time difference being then used to identify data which are at risk of loss or corruption, as above explained.

When the register is being updated, the time-stamps are written in dedicated fields of a lookup table through which each block of the non-volatile memory can be accessed and programmed.

Therefore, time info can be stored in the lookup table containing the address region of the stored data. However, other solutions can be adopted depending on the needs and/or circumstances and the present disclosure is not limited by a particular way of storing data. For instance, metadata info connected to the programmed page/region can also be used.

As previously mentioned, the register allows associating the stored time-stamps to regions of the memory device 101. According to an embodiment of the present disclosure, the time-stamps are associated with all the regions of the non-volatile memory 101 and the refresh operation is performed on all said regions when the elapsed time is equal to or exceeds a threshold time. The time-counter is then reset after the refresh operation performed by the refresh unit 103.

In another embodiment of the present disclosure, the provided time-stamps are associated only with selected regions of the non-volatile memory (e.g., the controller communicates only the address of specific blocks/regions) and the refresh operation is performed only on said regions of the non-volatile memory when the elapsed time is equal to or exceeds the threshold time. The time-counter is then reset after the refresh operation performed by the refresh unit 103.

However, the particular architecture of the memory device may vary according to the needs or circumstances without limiting the scope of the present disclosure.

In general, the time-counter is thus representative of the total time elapsed from the moment a data is written into the at least one region of the non-volatile memory, and the time-counter is reset each time a refresh operation is performed. The total elapsed time is the time-counter content after it has been increased by the difference between the power-up time stamp and the power-down time stamp.

According to a further embodiment of the disclosure, different time counters are associated with different respective regions of the non-volatile memory 101. In this case, a single counter is initialized each time a data is written/stored in a particular region of the non-volatile memory 101. Therefore, in this case, different regions have different elapsed times and the refresh unit 103 is configured to perform a selective refresh operation on a single region each time one of such elapsed times is equal or exceeds the threshold time. In other words, different time-counters are associated with respective specific regions of the non-volatile memory 101 and the provided time-stamps are used to selectively refresh one or more regions of the non-volatile memory 101. Each time-counter is then reset separately after the refresh operation performed by the refresh unit 103 on the respective particular region of the non-volatile memory 101. Clearly, the stored first and second time stamps are equal for all the regions of the non-volatile memory 101, the difference from one region to the other is given by the initial time of the counter (i.e. the starting point of the elapsed time).

The refresh operation usually results in a copy of a data from a previous region to another region of the non-volatile memory 101; therefore, the counter associated with data in such previous region is reset and a new counter is initialized.

For example, in a simplified case wherein the non-volatile memory 101 is divided into two regions, a first counter counts a first elapsed time from when a data is written or refreshed in a first region, such elapsed time being incremented by each measured off-time of the memory device 100 as calculated from the time difference between the provided first and second time stamps. The refresh module 103 then initiates a refresh operation to selectively refresh the first region when the elapsed time is equal to or exceeds the threshold time. Similarly, a second counter counts a second elapsed time from when a data is written or refreshed in a second region, such elapsed time being incremented by each measured off-time of the memory device 100 as calculated from the time difference between the provided first and second time stamps. The refresh module 103 then initiates a refresh operation to selectively refresh the second region when the elapsed time is equal to or exceeds the threshold time.

According to an embodiment, the time threshold is not a fixed value and can be varied, for example based on the erase cycle increase. In this case, the retention time is lower for blocks/regions with a higher number of erase cycles.

Figure 2:
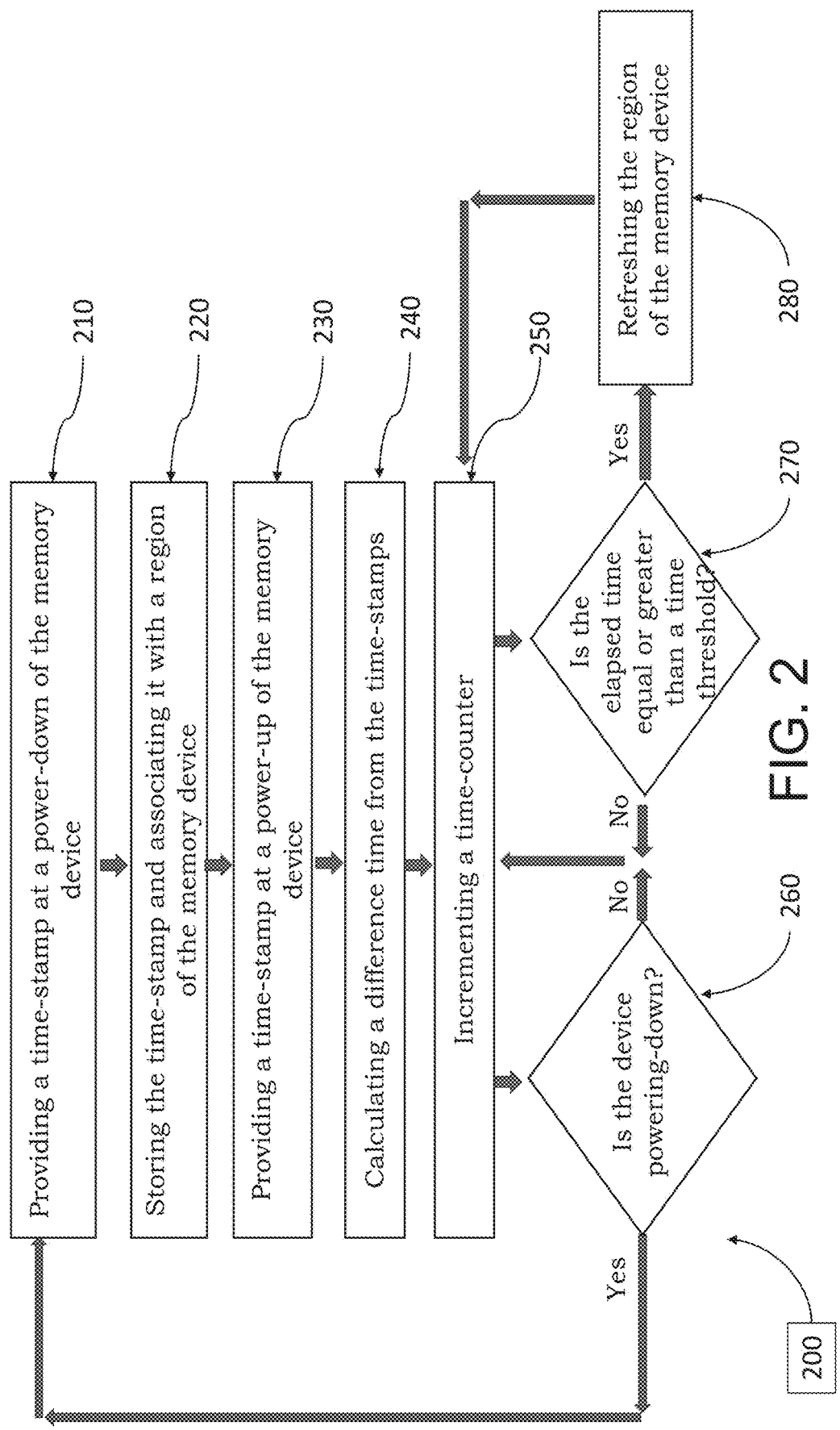
FIG. 2 shows a flow diagram of steps of a method according to an embodiment of the disclosure.

FIG. 2 shows a flow diagram of steps of a method according to one embodiment of the disclosure. The sequence in which the steps in method 200 are performed may be changed and some steps may be omitted or added in some embodiments.

Method 200 includes providing a time-stamp at a power-down of a memory device, at step 210. The time-stamp may be provided to the controller 102 described above, e.g., with reference to FIG. 1. In some embodiments the memory device may be a non-volatile memory device, for example with NAND, NOR or AND architecture.

Method 200 includes storing the time-stamp and associating it with a region of the memory device, at step 220. Storing the time-stamp and associating it with a region of the memory device may be carried out by the controller, for example controller 102. In some embodiments the region of the memory device may include a page, a block or group of blocks; in other embodiments the region may be the whole memory device.

Method 200 includes providing a time-stamp at a power-up of the memory device, at step 230. The time-stamp may be provided to the controller 102 described above, e.g., with reference to FIG. 1, at a memory device power-up subsequent to the power-down described in step 210.

Method 200 includes calculating a difference time from the time-stamps, at step 240. The difference time may be computed by the controller 102, with reference to FIG. 1, or in some cases by the host device 110. The difference time may correspond to the off-time of the memory device.

Method 200 includes incrementing a time-counter, at step 250. In some embodiments the time-counter may be representative of the time lapsed from the moment a data is written into the region of the non-volatile memory so that, after the incrementing, the time-counter may be representative of a total time elapsed since last writing into the region, including the off-time.

Method 200 includes checking if the elapsed time is equal to or greater than a time threshold, at step 270. The time threshold may be lower than or equal to the retention time limit of the memory device, in particular of the non-volatile memory device. The check at step 270 may be carried out by comparing the current time-counter with a predefined value corresponding to the retention time limit. In case the checking is negative (e.g., the elapsed time is less than the time threshold), method continues at step 250, e.g., time-counter is increased to continuously count the power-up time. In case the checking is positive (e.g., the elapsed time is equal or greater than the threshold time) method 200 continues with refreshing the region of the memory device, at step 280. The refreshing may be carried out by the refresh unit 103 under control of controller 102 as described above with reference to FIG. 1. The time-counter may be reset after the refresh operation performed and operation resumes from step 250, e.g., continuously counting the power-up time.

Method 200 includes checking if the device is powering-down, at step 260. If the checking is negative, e.g., the device is not powering down, operation continues from step 250 by incrementing the time-counter and continuously counting the power-up time; if the checking is positive, e.g., the device is powering down, the power-down time-stamp is provided for example to controller 102 and stored for future use at subsequent power-up.

Summing up, the present disclosure provides that the off-time of a memory device can be precisely calculated and used to perform a refresh of data contained in a non-volatile memory.

The disclosure provides a reliable and flexible manner to calculate the real lifetime of the device, including the storage time when the device is turned off. By comparing the first and second time stamps, the controller of the memory may determine how long it has been since the memory device was turned off.

The measured time difference is used to prevent loss of data, for example when it is realized that the memory device has been turned-off for a very long time (e.g. for several months) so that region/s of the non-volatile memory can be immediately refreshed. Therefore, the refresh operation can be performed based on the time difference between the first time-stamp and the second time-stamp.

The method and device of the present disclosure open the possibility to adapt the device management policy to the real usage of the device.

The method and device of the present disclosure can be applied to a wide variety of applications, especially to applications characterized by a non-predictable alternation of power-on and power-off events of the device.

For example, the memory device according to the present disclosure can be suitably embedded in a vehicular entity, such as autonomous and/or non-autonomous vehicles. In this case, the non-volatile memory can include all the information relating to the vehicle and/or to the drivers. In particular, in case of vehicles that are turned off for a very long time, it is highly desirable to precisely know the off-time thereof, so that data con be properly refreshed at the subsequent power up event as above illustrated. In this case, the vehicle is able to perform an auto-service to properly maintain the data in the vehicle.

It is clear that the above example is not limiting the present disclosure, as the disclosed memory device can by any suitable memory device, such as a storage device equipped with means apt to detachedly interface it to a host device.

In particular, any field can benefit from the present disclosure, such as the field of SD cards, USB sticks, industry computers and the like.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A method, comprising:
providing a first time-stamp, wherein the first time-stamp is a power-down time-stamp of a memory device that is provided while the memory device is powering down to be turned off, wherein a date and a time for the first time-stamp is provided by a clock unit on the memory device;
storing the first time-stamp and associating the first time-stamp with a region of a non-volatile memory of the memory device;
providing a second time-stamp, wherein the second time-stamp is a power-up time-stamp of the memory device that is provided while the memory device is powering up from a previous power down in which the memory device was turned off, wherein a date and a time for the second time-stamp is provided by the clock unit on the memory device;
associating the second time-stamp with the region of the non-volatile memory;
determining a difference time, wherein the difference time is a period of time between the first time-stamp and the second time-stamp;
incrementing a value of a time-counter by the difference time; and
based on the value of the time-counter after the time-counter is incremented by the difference time, performing a refresh operation of the region of the non-volatile memory.

2. The method of claim 1, further comprising performing the refresh operation if the value of the time counter after the time counter is incremented by the difference time is equal to or exceeds a threshold time.

3. The method of claim 2, wherein the threshold time is equal to or lower than a retention time limit of the non-volatile memory.

4. The method of claim 2, further comprising continuously counting the power-up time by the memory device in an on-state, and increasing the time-counter representative of the elapsed time based on the power-up time.

5. The method of claim 2, wherein the time-counter is representative of a total time elapsed from when data is written into the region of the non-volatile memory, and wherein the time-counter is reset each time the refresh operation is performed.

6. The method of claim 2, further comprising:
associating different time-counters with different respective regions of the non-volatile memory, each time-counter representing a respective elapsed time of the respective region; and
selectively performing the refresh operation if the respective elapsed time of the respective region is equal to or exceeds the threshold time.

7. The method of claim 1, further comprising storing the first and second time-stamps in a dedicated area of the non-volatile memory.

8. The method of claim 7, wherein storing the time-stamps includes updating fields of a register stored in the dedicated area.

9. The method of claim 1, further comprising storing the first time-stamp each time the memory device is powered-down and storing the second time-stamp each time the memory device is powered-up.

10. The method of claim 1, further comprising associating the first and the second time-stamps with all regions of the non-volatile memory and performing the refresh operation on all the regions of the non-volatile memory.

11. The method of claim 1, further comprising associating the first and the second time-stamps with a group of regions of the non-volatile memory and performing the refresh operation exclusively on the group of regions of the non-volatile memory.

12. The method of claim 1, wherein the region associated with the time-stamps is a page, a block, or a group of blocks of the non-volatile memory.

13. The method of claim 1, wherein the time-stamps are in the form of a Unix time-stamp.

14. A memory device, comprising:
a non-volatile memory; and
a controller of the non-volatile memory, wherein the controller is configured to:
receive a first time-stamp, wherein the first time-stamp is a power-down time-stamp of a memory device that is received while the memory device is powering down to be turned off, wherein a date and a time for the first time-stamp is provided by a clock unit on the memory device;
store the first time-stamp and associate the first time-stamp with a region of the non-volatile memory;
receive a second time-stamp, wherein the second time-stamp is a power-up time-stamp of the memory device that is received while the memory device is powering up from a previous power down in which the memory device was turned off, wherein a date and a time for the second time-stamp is provided by a clock unit on the memory device;
associate the second time-stamp with the region of the non-volatile memory;
determine a difference time, wherein the difference time is a period of time between the first time-stamp and the second time-stamp;
increment a time-counter by the difference time; and
based on a value of the time-counter after the time-counter has been incremented by the difference time, perform a refresh operation of the region of the non-volatile memory.

15. The memory device of claim 14, wherein:
the controller is configured to perform the refresh operation if the value of the time-counter after the time-counter has been incremented by the difference time is equal to or exceeds a threshold time; and
the threshold time is equal to or lower than a retention time limit of the non-volatile memory.

16. The memory device of claim 14, wherein the non-volatile memory includes a dedicated area configured to store the time-stamps.

17. The memory device of claim 16, wherein the dedicated area is configured to store operating information of the memory device.

18. The memory device of claim 14, wherein the controller is configured to:
store the time-stamps each time the memory device is powered-up and powered-down;
store the power-down time-stamp for all regions of the non-volatile memory; and
continuously count the power-up time when the memory device is in an on-state.

19. The memory device of claim 14, wherein the controller is configured to receive the time-stamps from a host device.

20. The memory device of claim 14, wherein the non-volatile memory is embedded in a vehicular entity.

21. The memory device of claim 14, wherein the memory device is configured to detachedly interface to a host device.

22. A method, comprising:
- providing a first time-stamp at a power-down of a memory device in which the memory device is turned off, wherein the first time-stamp is a power-down time-stamp of the memory device, wherein a date and a time for the first time-stamp is provided by a clock unit on the memory device;
- storing the first time-stamp in a non-volatile memory of the memory device and associating the first-time stamp with a region of the non-volatile memory;
- providing a second time-stamp at a subsequent power-up of the memory device from a previous power down in which the memory device was turned off, wherein the second time-stamp is a power-up time-stamp of the memory device, wherein a date and a time for the second time-stamp is provided by the clock unit on the memory device;
- associating the second-time stamp with the region of the non-volatile memory;
- determining a difference time, wherein the difference time is an off-time of the memory device between the first time-stamp and the second time-stamp;
- incrementing a time-counter by the difference time; and
- based on a value of the time-counter after the time-counter has been incremented by the difference time, perform a refresh operation of the region of the non-volatile memory.

\* \* \* \* \*